United States Patent [19]
Kondoh et al.

[11] Patent Number: 5,474,976
[45] Date of Patent: Dec. 12, 1995

[54] PRODUCTION OF OXIDE SUPERCONDUCTORS HAVING LARGE MAGNETIC LEVITATION FORCE

[75] Inventors: Akihiro Kondoh, Kobe; Masato Murakami, Tokyo; Hiroshi Takaichi, Tokyo; Naoki Koshizuka, Tokyo; Shoji Tanaka, Tokyo; Shoichi Kagiya, Tokyo, all of Japan

[73] Assignees: International Superconductivity Technology Center, Tokyo; Kawasaki Jukogyo Kabushiki Kaisha, Kobe; Hokuriku Electric Power Co., Toyama; Nippon Steel Corporation, Tokyo, all of Japan

[21] Appl. No.: 39,561

[22] Filed: Mar. 29, 1993

[30] Foreign Application Priority Data

Mar. 27, 1992 [JP] Japan ................................. 4-101952
Mar. 27, 1992 [JP] Japan ................................. 4-101954

[51] Int. Cl.$^6$ ................................................. H01L 39/12
[52] U.S. Cl. ......................... 505/450; 264/82; 264/122; 264/125
[58] Field of Search ..................... 264/109, 122, 264/125, 140, 82; 505/1, 725, 779, 780, 450, 490, 500, 300

[56] References Cited

U.S. PATENT DOCUMENTS

| | | | |
|---|---|---|---|
| 4,892,861 | 1/1990 | Ray | 505/1 |
| 4,990,493 | 2/1991 | Lay | 505/1 |
| 5,017,548 | 5/1991 | Hirakawa et al. | 505/1 |
| 5,057,487 | 10/1991 | Parker et al. | 505/1 |

FOREIGN PATENT DOCUMENTS 0292126 11/1988 European Pat. Off. .
0406456 1/1991 European Pat. Off. .

OTHER PUBLICATIONS

JP Abstract 89–244553/34, Derwent Publications, 1989.
"Superconductivity of $YBa_2Cu_3O_{7-x}$ by Addition of Reactive Fine Powders", Sakai et al., *Japanese Journal of Applied Physics*, vol. 30, No. 2, pp. 246–250, Feb. 1991.
"Effects of the Platinum Group Element Addition on Preparation of YBCO Superconductor by Melt Growth Method", Yoshida et al., *Physica c Superconductivity*, vol. 185–189 Part IV, Dec. 1, 1991.

*Primary Examiner*—Christopher A. Fiorilla
*Attorney, Agent, or Firm*—Oliff & Berridge

[57] ABSTRACT

A method for producing an REBaCuO oxide superconductor having large magnetic levitation force, where RE is a rare earth element selected from the group consisting of Y, Sm, Eu, Gd, Dy, Ho, Er, and Yb, involves the steps of using a raw material mixture as the starting feed, heating the raw material mixture for partial melting, followed by cooling and solidification, pulverizing and mixing the resulting solid, shaping the resulting mixture into a given shape, placing or embedding nucleates on or in the resulting shape, followed by heating for partial melting, and cooling the resulting partial melt to a substantial temperature at which a superconducting phase starts to form, followed by slow cooling, whereby the superconducting phase is preferentially formed and grown from a nucleation site.

18 Claims, 2 Drawing Sheets

PRODUCTION OF OXIDE SUPERCONDUCTORS HAVING LARGE MAGNETIC LEVITATION FORCE

BACKGROUND OF THE INVENTION

1. Field of the Invention

The present invention relates to the production of a novel REBaCuO oxide superconductor or superconducting oxide and, more particularly, to the fabrication of a superconducting oxide having large magnetic levitation force, which is intended for use with fly wheels, magnetic bearings; delivery systems, etc., that harness magnetic levitation.

2. Prior Art

In recent years, REBaCuO superconducting oxides have started to be used for application to fly wheels, etc., by magnetic levitation. These superconductors, for instance, have been produced by the melt powder melt growth (MPMG) technique—see H. Fujimoto and co-workers, "Proc. of ISS '89", Sprinter-Verlag, p. 285, 1990.

Set out below is one typical example of superconductor production by this technique. First, the powder feed, e.g., $Y_2O_3$, $BaCO_3$ and $CuO$, are mixed together at a predetermined ratio. The mixture may have been calcined and pulverized. Further, the powders are heated to a temperature at which $RE_2O_3$ and liquid phases coexist, e.g., 1,400° C. for partial melting (M). Subsequently, the melt is cooled down for solidification. This is followed by pulverization (P), mixing and shaping. The shape is then heated to a temperature at which an $RE_2BaCuO_5$ phase (hereinafter referred simply to as the 211 phase) and a liquid phase coexist, e.g., 1,100° C. for partial melting (M). After this, the partial melt is cooled down to a temperature at which a superconducting $REBa_2Cu_3O_d$ phase (hereinafter simply called the 123 phase) forms, from which it is slowly cooled at a given rate, e.g., 1° C./h, thereby forming and growing (G) the 123 phase for superconductor production.

A superconductor fabricated with the use of this technique shows a high critical current density. In order to increase the magnetic levitation force of this superconductor, however, it is required not only to elevate the critical current density but to increase superconducting crystal size as well—see M. Murakami and co-workers, "Japanese Journal of Applied Physics", Vol. 29, No. 11, p. 1991, 1990. For increasing superconducting crystal size, crystal formation and growth must be placed under control. So far, however, this control could not have be done; that is, some considerable difficulty has been involved in producing a superconductor composed of large superconducting crystals and having increased magnetic levitation force.

Another approach for superconductor production is the quench and melt growth (QMG) technique—see M. Murakami and co-workers, "Japanese Journal of Applied Physics", Vol. 28, No. 7, p. 1189, 1989. Set out below is one typical example of superconductor production by this technique. First, the powder feed, e.g., $Y_2O_3$, $BaCO_3$ and $CuO$, are mixed together at a predetermined ratio. Then, the mixture is heated to a temperature at which $RE_2O_3$ and liquid phases coexist, e.g., 1,400° C. for the partial melting of the raw material powders, followed by quenching (Q) or rapid cooling for solidification. In this rapidly solidified structure, the $RE_2O_3$ phase is dispersed throughout the solidified liquid phase. The rapidly solidified structure is then heated to a temperature at which the 211 and liquid phases coexist, e.g., 1,100° C. for partial melting (M). After this, the melt is cooled down to a temperature at which the 123 phase forms, whence it is slowly cooled at a given rate, e.g., 1° C./hour, thereby forming and growing (G) the 123 phase for superconductor production. This technique may be said to be a process alternative to the above MPMG technique, from which the steps of pulverizing, mixing and shaping the solidified body are removed. A superconductor fabricated by this technique, too, shows a locally high critical current density.

However, the thickness of the rapidly solidified body mentioned above is at most about 5 mm in a single, simple quenching operation; any thick superconductor could not be obtained by the QMG technique. To ward off this disadvantage, the so-called multi-quenching technique has been developed—see M. Morita and co-workers, "Proc of ISS '90," Springer-Verlag, p.733, 1991. This technique may prima facie enable some thick superconductor to be fabricated, but leaves the following problems intact.

(1) Mechanical processing is needed for forming the rapidly solidified (quenched) body into any desired shape. However, it is very difficult to obtain any desired shape by mechanical processing, because the rapidly solidified body is so brittle that mechanical processing is difficult for shaping.

(2) In carrying out the multi-quenching technique, the already quenched, solidified body is unavoidably affected by the thermal history of the partial melt that is to be quenched later.

(3) In order to fabricate a thick solidified body by multi-quenching, it is required to carry out quenching several times, and this is labor-consuming.

(4) The $RE_2O_3$ phase dispersed in the quenched, solidified body is relatively large in size, and so makes it difficult to obtain a desired superconducting structure—see Fujimoto and co-workers, "Gryogenic Engineering", Vol. 25 No. 2, p. 77, 1990.

The MPMG technique, because of being designed to carry out shaping after the pulverization and mixing of the solidified body, has some merits, mentioned just below, and so can be taken as being a very excellent method.

(1) The mixture can be shaped in any desired configuration.

(2) It is possible to add useful additives such as silver oxide to the solidified powders in the course of mixing them.

(3) The solidification and mixing of the solidified body permits the $RE_2O_3$ phase dispersed therein to be concurrently pulverized and mixed, giving a fine and uniform $RE_2O_3$ phase—see Fujimoto and co-workers, "Gryogenic Engineering", Vol. 25, No. 2, p. 77, 1990.

According to some report, one recently developed technique for increasing superconducting crystal size has well succeeded in achieving crystal size increases by seeding a $SmBa_2Cu_3O_d$ single crystal—that is produced by the QMG technique and then cleaved in precursor to which a Yb—Y composition gradient is imparted with a $Yb_{1-x}Y_xBa_2Cu_3O_d$ composition—at around 1,030° C. (in the cooling process in the MG steps of the QMG technique or anytime from the partial melting to the initiation of the slow cooling for forming and growing the superconducting phase). For this, see M. Morita and co-workers, "Proc. of ISS '90", Springer-Verlag, p. 733, 1991. A patent specification directed to this method has already been published for public inspection (under No. WO91/19029). However, this method is unfit for mass production, because much time and labor are needed for fabricating the precursor having a composition gradient, producing the above seed single crystal, and placing it on the precursor.

According to some reports on the MPMG technique, on the other hand, when silver or silver oxide is added at the time of the above pulverization of the solidified powders, cracks in the produced superconductor are reduced well-enough to improve the magnetic levitation force—see M. Murakami and co-workers, "Japanese Journal of Applied Physics", Vol. 29, No. 11, p. 1991, 1990. Further, according to another report, when platinum or a platinum compound is added at the time of the pulverization of the solidified powders, a critical current density of the produced superconductor is improved (Japanese patent application No. 68627/1991). Even when these additives are used, crystal formation and growth must be placed under control, as is the case with the absence of any additive, thereby achieving increases in superconducting crystal size and magnetic levitation force.

In view of the problems mentioned above, a primary object of the invention is to provide a method for producing a superconducting oxide having large magnetic levitation force, which enables the superconducting crystals obtained by the MPMG technique to be increased in their size and so improved in terms of their magnetic levitation force.

SUMMARY OF THE INVENTION

The present invention provides a method for producing an REBaCuO oxide superconductor having large magnetic levitation force, where RE is a rare earth element selected from the group consisting of Y, Sm, Eu, Gd, Dy, Ho, Er, and Yb, is disclosed, which involves the steps of using a raw material mixture as the starting feed, heating the raw material mixture for partial melting, followed by cooling and solidification, pulverizing and mixing the resulting solid, shaping the resulting mixture into a given shape, placing or embedding nucleants on or in the resulting shape, followed by heating for partial melting, and cooling the resulting partial melt to a substantial temperature at which a superconducting phase starts to form, followed by slow cooling, whereby the superconducting phase is preferentially formed and grown from nucleation site.

According to one embodiment of the process of the invention, platinum or platinum compound powders may be added to the above pulverized powders. According to another embodiment of the invention, silver or silver oxide powders may be added to those pulverized powders.

The invention rudimentarily involves starting feed preparation wherein powdery raw materials—that may have been calcined and pulverized—are mixed, partially melting the starting feed, cooling the partial melt for solidification, pulverizing and mixing the solid, and shaping or compacting the mixture. In the production method wherein the thus obtained compact is partially melted, cooled down to a temperature at which the 123 phase that is a superconducting phase is formed, and is slowly cooled from that temperature, thereby forming and growing the 123 phase or, in another parlance, in the above-mentioned MPMG process, the invention is characterized in that powders or single crystals as the nucleants are placed on or embedded in the surface of the compact anytime from the completion of the compacting to just before the initiation of the slow cooling for the growth of the 123 phase, whence the superconducting phase is preferentially formed and grown.

The invention makes it possible to increase the size of the crystals of the 123 phase that is a superconducting phase by a simple method, thus enabling the magnetic levitation force to be increased. It is noted that this effect has been found even when silver or silver oxide is added.

In addition, the invention is well applicable to a superconductor produced by a conventional process, which consists of small superconducting crystals and so has low magnetic levitation force. In other words, the superconductor is partially melted with powders or single crystals as the nucleants placed on or embedded in the surface thereof, thereby separating it into the abovementioned 211 and liquid phases. After this, the superconducting phase is preferentially formed and grown from nucleation site, thereby achieving a crystal size increase.

BRIEF DESCRIPTION OF THE DRAWINGS

The features of the invention which are believed to be novel are particularly pointed out and distinctly claimed in the concluding portion of this specification. However, the invention may be best appreciated by reference to the following detailed description taken in conjunction with the drawings, in which:

DETAILED DESCRIPTION OF THE INVENTION

In the ensuing description, the invention will be explained at great length.

Set out below is a typical example of how the process of superconductor production according to the invention is carried out. The invention will now be explained more specifically with reference to this example.

Step 1

First, the starting feed for REBaCuO superconductors is prepared prior to the partial melting thereof. At least one rare earth element RE is selected from the group consisting of Y, Sm, Eu, Gd, Dy, Ho, Er, and Yb. For instance, $Y_2O_3$, $BaCO_3$, and CuO are mixed together at a predetermined ratio to prepare mixed powders of REBaCuO as the feed powders. It is here noted that the reason for using $BaCO_3$ is that it is decomposable into an oxide when the mixed powders are later partially melted.

For the mixed powders to be used as the starting feed, they may be further calcined and pulverized.

Step 2

The starting feed mentioned above is retained at a temperature of 950° to 1,500° C. for 1 to 60 minutes to form an $RE_2O_3$ phase and a liquid phase (composed of oxides of Ba and Cu) or the 211 and liquid phase or, in other words, is subjected to partial melting.

Step 3

The partial melt obtained at Step 2 is cooled by air cooling or at a cooling rate that equals or exceeds that of the air cooling for solidification.

Step 4

The thus obtained solid is finely pulverized to a particle diameter in the range of 0.1 to 50 μm. The fine powders are then well mixed together to prepare a homogeneous powder mixture. This is to enable the components of the 211 and liquid phase to be homogeneously dispersed at Step 6 to be described later. In the course of this mixing, platinum or platinum compound powders may be added to the fine powders in an amount of 0.1 to 2% by weight, calculated as platinum. The platinum compound used, for instance, may be $Pt_2Ba_4CuO_9$. Here, too, other useful additives such as silver or silver oxide may be added to the fine powders in an amount of 1 to 25% by weight.

Subsequently, the fine powders are formed into a desired shape.

Step 5

Here, powders or single crystals are placed or embedded as nucleants somewhere on or in the shape, as desired. For embedding, the nucleants may be located somewhere in the shape. This step may be done until just before the start of slow cooling or the next Step 6. However, this should preferably be done here, because it then takes less time and labor.

On the other hand, the nucleants can produce its own effect sufficiently, when used in an amount of at most about 10 mg for the powders and in a size of about 1 mm² for the single crystals. The nucleants used, for instance, may be rare earth element-containing oxides such as $Y_2O_3$, $Nd_2O_3$, $Sm_2O_3$, $Eu_2O_3$, $La_2O_3$, $Gd_2O_3$, $Dy_2O_3$, $Ho_2O_3$, $Er_2O_3$, $Yb_2O_3$, $Y_2BaCuO_5$, $Sm_2BaCuO_5$, $Eu_2BaCuO_5$, $Gd_2BaCuO_5$, $Dy_2BaCuO_5$, $Ho_2BaCuO_5$, $Er_2BaCuO_5$ and $Yb_2BaCuO_5$, $YBa_2Cu_3O_d$, $NdBa_2Cu_3O_d$, $EuBa_2Cu_3O_d$, $LaBa_2Cu_{3d}$, $GdBa_2Cu_3O_d$, $DyBa_2Cu_3O_d$, $HoBa_2Cu_3O_d$, $ErBa_2Cu_3O_d$, and $YbBa_2Cu_3O_d$ wherein d ranges from 6.3 to 7. Besides, at least one member selected from the group consisting of $CeO_2$, $ZrO_2$, $BaSnO_3$, $BaZrO_3$, MgO, $SrTiO_3$, and metals of the platinum group, i.e., Pt, Pd, Rh, Ir, Os, and Ru may be used. Similar effects as mentioned above are obtainable even when single crystals of the oxides mentioned above are used as the nucleants in addition to the oxides or metal powders mentioned above.

Step 6

This shape is heated at a temperature lying in the range of 950° to 1,250° C. at which the 211 phase mentioned above is formed for partial melting, and is then retained at that temperature for 15 to 90 minutes, from which it is cooled down to a temperature somewhat higher than the temperature at which the 123 phase mentioned above starts to form from the 211 and liquid phases mentioned above, e.g., to a temperature somewhat higher than 1,000° C. when RE is Y and the atmosphere is air, at a cooling rate of 10° to 1,000° C. per hour. Subsequently, the shape is slowly cooled from this temperature down to 850° to 950° C. at a cooling rate of 0.2° to 20° C. per hour. Why the slow cooling is done from the temperature mentioned is that when this temperature is low, the 123 phase is most likely to form wherever it forms. It is desired that the slow cooling is carried out with some temperature gradient. In this case, it is preferable that a temperature gradient of 1° C./cm or more is set around the location of the shape on or in which the nucleants are placed or embedded, whereby the temperature of that location reaches a low.

When carrying out this step, a costly platinum table has so far been used for supporting the shape so as to minimize the contamination of a superconductor by the table. However, this table is of high wettability with respect to the liquid phase mentioned above, so that some considerable amount of the liquid phase can flow out. An outflow of the liquid phase gives rise to a composition departure, which does not permit the superconducting phase to grow to the last and, eventually, results in a decrease in superconducting crystal size. To increase the superconducting crystals, therefore, it is required to minimize the outflow of the liquid phase. In this context, the inventors have now found that a table built up of alumina, mullite, magnesia, or partially stabilized magnesia is lower in the wettability with respect to the liquid phase than the platinum table, so that the outflow of the liquid phase can be reduced.

Here, too, it is possible to locate a buffer between the table and the shape, thereby achieving prevention of the contamination of the superconducting layer by the table and prevention of preferential growth of the superconducting phase from the surface of contact of the partial melt shape with the table. Basically, the buffer should be made up of the 123 phase having an RE composition that is higher in the temperature at which the 123 phase is formed from the 211 and liquid phase than the RE of the 123 phase of the shape.

However, the sole use of the 123 phase is less practical, because it is so soft at the temperature for the partial melting mentioned above that it is likely to be deformed. The inventors have now found that the 123 phase throughout which the 211 phase is minutely dispersed, or the starting material is well fit for a buffer having an improved viscosity. For instance, mention is made of an MPMG superconductor in which the 211 phase is minutely dispersed throughout the 123 phase, or the solid that is the starting material thereof, and so on.

Step 7

Following Step 6, the product may be cooled from 850° to 950° C. down to room temperature at any desired cooling rate.

If required, the thus fabricated superconductor may be retained at a temperature lying in the range of 650° to 300° C. for 2 to 500 hours, or may be cooled from a high of 650° C. to a low of 300° C. over 2 to 500 hours, in an oxygen-enriched atmosphere, thereby adding sufficient oxygen thereto. After this, it may be cooled at any desired cooling rate.

As already mentioned, the invention may be applied to a superconductor that is conventionally produced and so consists of small superconducting crystals and has low magnetic levitation force. That is, the powders or single crystals are placed as the nucleants on the surface of this superconductor, and the superconductor is then subjected to the steps 5 to 7 mentioned above, so that these crystals can be increased.

According to the invention, it is thus possible to fabricate an REBaCuO oxide superconductor having large magnetic levitation force, using the nucleants.

The following examples are intended to illustrate and not to limit the scope of the invention in all its aspects.

EXAMPLES

Example 1

$Y_2O_3$, $BaCO_3$ and CuO powders were mixed together at a molar Y:Ba:Cu ratio of 1.8:2.4:3.4. Following this, the mixture was heated at 1,400° C. for 20 minute, followed by cooling. The product was pulverized and mixed, and the mixture was then shaped into a pellet. About 10 mg of powders of $Y_2O_3$, $Sm_2O_3$, $Eu_2O_3$, $La_2O_3$, $Gd_2O_3$, $Sm_2BaCuO_5$, $Eu_2BaCuO_5$, $NdBa_2Cu_3O_d$, $EuBa_2Cu_3O_d$, $LaBa_2Cu_3O_d$, $CeO_2$, $ZrO_2$ $BaSnO_3$, $BaZrO_3$, MgO, $SrTiO_3$, Pt, Pd, Rh, Ir, Os, or Ru was embedded as the nucleants in the center of the upper surface of each pellet. The disc was then heated at 1,100° C. for 30 minutes for separation into the 211 phase and liquid phases mentioned above, which were cooled down to 1,010° C. over 10 minutes (note that the temperature of formation of the 123 phase is about 1,000° C. in the air). After this, the disc was slowly cooled down to about 900° C. at 1° C. per hour, followed by furnace cooling. Subsequently, the disc was heated at 600° C. for 1 hour in a 1-atm oxygen stream, and finally subjected to furnace cooling to produce a superconductor pellet of about 26 mm in diameter and about 6 mm in height. For the purpose of comparison, a superconductor pellet was prepared with no nucleants placed thereon.

Figure 1:
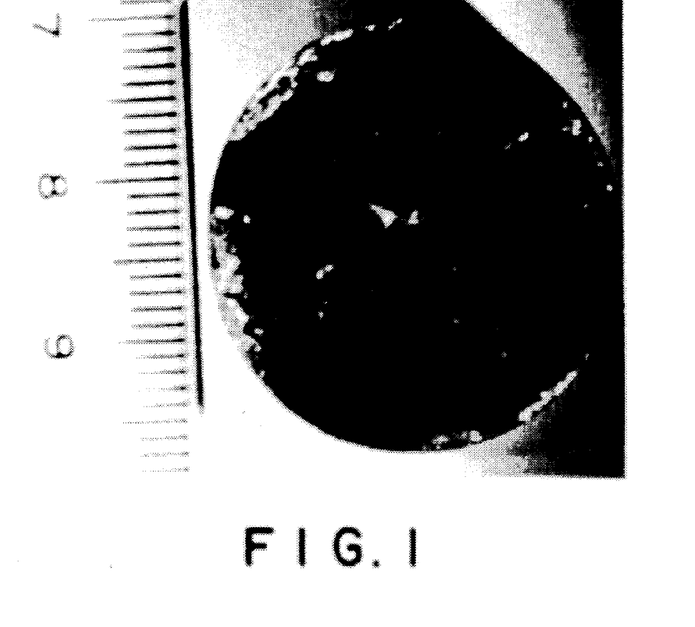
FIG. 1 is a microphotograph of a superconducting crystal obtained with nucleants in Example 1 of the invention.
Figure 2:
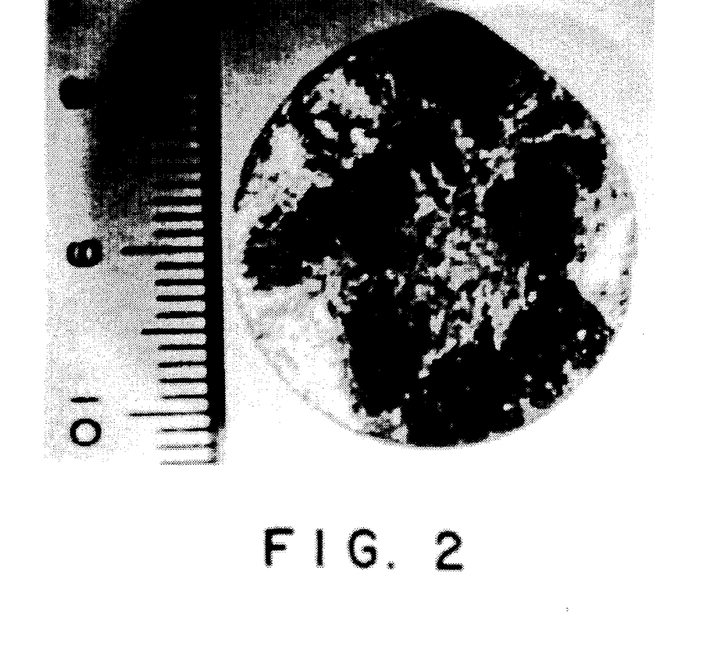
FIG. 2 is a microphotograph of a superconducting crystal obtained following Example 1 with the exception that no nucleants are used.

As can be understood from Table 1, the superconductor pellet with no nucleants embedded therein is 0.6 cm2 in crystal size, as observed from above, whereas each superconductor pellet with the nucleants embedded therein is increased in crystal size to 1.0 cm2 or more. Photographs of the superconductor crystals with and without the nucleants embedded therein, respectively, are attached hereto—FIGS. 1 and 2. A comparison of these photographs reveals that greater crystal size can be achieved according to the invention.

Example 2

Superconductor pellets were prepared, with and without the nucleants used in Example 1, following the procedure of Example 1. Pellet size was the same as in Example 1. These pellets were measured as to their magnetic levitation forces, using a permanent magnet having a diameter of 32 mm and a surface flux density of 0.4 T (tesla). As set out in Table 1, the magnetic levitation force of the pellet with no nucleants embedded therein is 1.4 kgf, whereas those of the pellets with the nucleants embedded therein are elavated to 1.7 kgf or more.

Example 3

Superconductor pellets were prepared following the procedure of Example 1 with the exception that $RE_2O_3$ was used in place of $Y_2O_3$ of the starting feed for superconductor production and about 10 mg of Pt powders was placed on the center of the upper surface of each shape. The magnetic levitation forces of these pellets, as measured following the procedure of Example 2, are set out in Table 2, which reveals that the effect of the Pt powders placed is found throughout the RE systems.

Example 4

$Yb_2O_3$, $BaO_2$ and CuO powders were mixed together at a molar Yb:Ba:Cu ratio of 1.8:2.4:3.4. Following this, the mixture was heated at 1,400° C. for 20 minute, followed by cooling. The product was pulverized and mixed, and the mixture was then shaped into a pellet. About 10 mg of powders of $Y_2O_3$, $Sm_2O_3$, $Er_2O_3$, $Yb_2BaCuO_5$, $Er_2BaCuO_5$, $YbBa_2Cu_3O_d$, and $ErBa_2Cu_3O_d$, $EuBa_2Cu_3O_d$ was embedded as the nucleants on the center of the upper surface of each shape. The shape was then heated at 1,060° C. for 30 minutes for separation into the 211 phase and liquid phases, which were in turn cooled down to 960° C. over 10 minutes. After this, the product was slowly cooled down to about 850° C. at 1° C. per hour, followed by furnace cooling. Subsequently, the product was heated at 600° C. for 1 hour in a 1-atm oxygen stream, and finally subjected to furnace cooling to make a superconductor pellet of about 26 mm in diameter and about 6 mm in height. For the purpose of comparison, a superconductor pellet was prepared with no nucleants placed thereon.

As can be understood from Table 3, the magnetic levitation force of the superconductor pellet with no nucleants placed thereon, as measured following the procedure of Example 2, is 1.0 kgf, whereas those of the pellets with the nucleators placed on them were brought up to 1.3 kgf or more.

Example 5

$Y_2O_3$, $BaCO_3$ and CuO powders were mixed together at a molar Y:Ba:Cu ratio of 1.8:2.4:3.4. Following this, the mixture was heated at 1,400° C. for 20 minute, followed by cooling. The product was pulverized and mixed, and the mixture was then shaped into a pellet. About 10 mg of $Nd_2O_3$ powders was embedded as the nucleants in one vertically central location of the side of the pellet. Subsequently, the disc was heated at 1,100° C. for 30 minutes for separation into the 211 and liquid phases, which were in turn cooled down to 1,040° C. over 10 minutes. After this, the pellet was slowly cooled down to 850° C. at 1° C. per hour with a temperature gradient of 2° C./cm, 6° C./cm, or 10° C./cm in such a way that the temperature of the nucleants-embedded side of the pellet reached a low, followed by furnace cooling. In this example, the table used was made of alumina and a disc of 30-mm-diameter and 3-mm-height shape, made of $YbBa_2Cu_3O_d$ with a $Yb_2CuBaO_5$ phase dispersed in it, was put as a buffer between the pellet and the table. Then, the pellet was heated at 600° C. for 1 hour in a 1-atm oxygen stream, and finally subjected to furnace cooling to prepare a superconductor pellet of about 36 mm in diameter and about 12 mm in height. For the purpose of comparison, a superconductor pellet with no nucleates embedded in it was prepared as well.

These superconductor pellets were measured as to their magnetic levitation forces, following the procedure of Example 2. The results, as set out in Table 4, are that the effect of the $Nd_2O_3$ powders embedded is found in the superconductors produced with some temperature gradients.

Example 6

$Y_2O_3$, $BaCuO_2$ and CuO powders were mixed together at a molar Y:Ba:Cu ratio of 1.8:2.4:3.4. Following this, the mixture was heated at 1,400° C. for 20 minutes, followed by cooling and pulverization. $Ag_2O$ powders were then sufficiently mixed with the resulting powders in the respective amounts of 1% by weight, 5% by weight, 10% by weight, 15% by weight, 20% by weight, and 25% by weight. Each mixture was shaped into a pellet. $Nd_2O_3$ powders (ca. 10 mg) were embedded as the nucleants in the center of the upper surface of the pellet. The pellet was then heated at 1,100° C. for 30 minutes for separation into the 211 and liquid phases, which were cooled down to 1,010° C. over 10 minutes. After this, the pellet was slowly cooled down to 900° C. at 1° C. per hour, followed by furnace cooling. The pellet was subsequently heated at 600° C. for 1 hour in a 1-atm oxygen stream, and finally subjected to furnace cooling to prepare a superconductor pellet of about 26 mm in diameter and 6 mm in height. For the purpose of comparison, a superconductor pellet with no nucleates embedded in it was prepared as well. These superconductor pellets were measured as to their magnetic levitation forces, following the procedure of Example 2.

The results set out in Table 5 indicate that the $Nd_2O_3$ powders embedded produce their own effect irrespective of in what amounts $Ag_2O$ is added.

Example 7

$YBa_2Cu_3O_d$ and $Y_2CuBaO_5$ powders were mixed together at a molar Y:Ba:Cu ratio of 1.8:2.4:3.4. Following this, the mixture was heated at 1,400° C. for 20 minutes, followed by cooling. The product was then pulverized and mixed, and the mixture was shaped into a pellet. $Sm_2O_3$ and $Nd_2O_3$ powders (ca. 10 mg) were respectively embedded as the nucleants in the centers of the lower surfaces of the pellets. Each pellet was heated at 1,100° C. for 30 minutes for separation into the 211 and liquid phases, which were then cooled down to 1,010° C. over 10 minutes. After this, the pellet was slowly cooled down to 880° C. at 1° C. per hour with a temperature gradient of 1° C./cm in such a way that the temperature of the lower surface thereof reached a low, followed by furnace cooling. In this example, the table used was made up of alumina. Subsequently, the pellet was heated at 600° C. for 1 hour in a 1-atm oxygen stream, and finally subjected to furnace cooling to make a superconductor pellet of about 36 mm in diameter and about 12 mm in height. For the purpose of comparison, a superconductor pellet with no nucleants embedded in it was fabricated as well. These superconductor pellets were measured as to their magnetic levitation forces, following the procedure of Example 2.

The results set out in Table 6 indicate that the effects of the $Sm_2O_3$ and $Nd_2O_3$ powders are found in the superconductors thus produced.

Example 8

$Y_2CuBaO_5$, $BaCuO_2$ and CuO powders were mixed together at a molar Y:Ba:Cu ratio of 1.8:2.4:3.4. Following this, the mixture was heated at 1,400° C. for 20 minutes, followed by cooling. The product was pulverized and mixed, and the mixture was then shaped into a pellet. MgO and $SrTiO_3$ single crystals of 2 mm$^2$ in size were respectively placed as the nucleates on the centers of the upper surfaces of the pellets. Subsequently, the pellets were heated at 1,100° C. for 30 minutes for separation into the 211 and liquid phases, which were cooled down to 1,010° C. over 10 minutes. After this, each pellet was slowly cooled down to 880° C. at 1° C. per hour, followed by furnace cooling. Subsequently, the pellet was heated at 600° C. for 1 hour in a 1-atm oxygen stream, and finally subjected to furnace cooling to prepare a superconductor pellet. For the purpose of comparison, a superconductor pellet with no single crystal nucleates placed on it was fabricated as well. Pellet size was about 26 mm in diameter and about 6 mm in height. These superconductor pellets were measured as to their magnetic levitation forces, following the procedure of Example 2.

The results set out in Table 7 indicate that the effects of the MgO and $SrTiO_3$ single crystals placed produce their own effects.

Example 9

$Y_2O_3$, $BaCO_3$ and CuO powders were mixed together at a molar Y:Ba:Cu ratio of 1.8:2.4:3.4. Following this, the mixture was heated at 1,400° C. for 20 minutes, followed by cooling. The product was pulverized and mixed, and the mixture was then shaped into a pellet. This pellet was further heated at 1,100° C. for 30 minutes for separation into the 211 and liquid phases, which were cooled down to 1,000° C. over 10 minutes After this, the pellets were slowly cooled down to 900° C. at 1° C. per hour, followed by furnace cooling. Subsequently, the pellet was heated at 600° C. for 1 hour in a 1-atm oxygen stream, and finally subjected to furnace cooling to produce a superconductor pellet of about 36 mm in diameter and about 13 mm in height. The magnetic levitation force of this pellet, as measured following the procedure of Example 2, was barely 3.5 kgf.

Nucleants, $Sm_2O_3$ (about 10 mg), were placed on the center of the upper surface of this pellet, which was again heated at 1,100° C. for 30 minutes and then cooled down to 1,010° C. over 10 minutes. After this, the pellet was slowly cooled down to 900° C. at 1° C. per hour, followed by furnace cooling. The pellet was further heated at 600° C. for 1 hour in a 1-atm oxygen stream, and finally subjected to furnace cooling to remake a superconductor pellet.

The magnetic levitation force of this remade pellet, as measured following the procedure of Example 2, was found to be increased to 4.5 kgf.

TABLE 1

Embedded Nucleants, Crystal Size, and Magnetic Levitation Force

| Embedded Nucleants | Crystal Size cm$^2$, as measured from above | Magnetic Levitation Force kgf |
|---|---|---|
| — | 0.6 | 1.4 |
| $Sm_2O_3$ | 4.8 | 2.7 |
| $Nd_2O_3$ | 4.6 | 2.8 |
| $Eu2O_3$ | 4.8 | 2.6 |
| $La_2O_3$ | 2.0 | 1.7 |
| $Gd_2O_3$ | 2.9 | 2.3 |
| $Y_2O_3$ | 1.5 | 1.7 |
| $Sm_2BaCuO_5$ | 3.5 | 2.4 |
| $Eu_2BaCuO_5$ | 2.8 | 2.0 |
| $NdBa_2Cu_3O_d$ | 2.4 | 3.2 |
| $EuBa_2Cu_3O_d$ | 2.1 | 1.9 |
| $CeO_2$ | 1.5 | 2.0 |
| $ZrO_2$ | 4.8 | 2.9 |
| $BaSnO_3$ | 1.1 | 1.8 |
| $BaZrO_3$ | 1.2 | 1.7 |
| MgO | 1.5 | 1.8 |
| $SrTiO_3$ | 1.4 | 1.9 |
| Pt | 3.0 | 2.6 |
| Pd | 4.4 | 2.0 |
| Rh | 2.6 | 2.9 |
| Ir | 1.3 | 1.7 |
| Ru | 2.9 | 2.0 |
| Os | 2.0 | 3.7 |

TABLE 2

Substituent, and Magnetic Levitation Force

| Substituent for Y | Magnetic Levitation Force, kgf |
|---|---|
| Sm | 2.2 |
| Eu | 2.4 |
| Gd | 2.2 |
| Dy | 2.3 |
| Ho | 2.1 |
| Er | 2.5 |
| Yb | 2.1 |

TABLE 3

Embedded Nucleants, and Magnetic Levitation Force kgf

| Embedded Nucleants | Magnetic Levitation Force, kgf |
|---|---|
| — | 1.0 |
| $Yb_2O_3$ | 1.5 |
| $Er_2O_3$ | 1.7 |
| $Yb_2BaCuO_5$ | 1.3 |
| $Er_2BaCuO_5$ | 1.5 |
| $YbBa_2Cu_3O_d$ | 1.4 |
| $ErBa_2Cu_3O_d$ | 1.6 |

TABLE 4

Magnetic Levitation Force Measured with Temperature Gradients

| Temp. Gradient °C./cm | Magnetic Levitation Force with no $Nd_2O_3$ Embedded, kgf | Magnetic Levitation Force, with $Nd_2O_3$ Embedded, kgf |
| --- | --- | --- |
| 2 | 5.4 | 8.5 |
| 6 | 5.1 | 8.1 |
| 10 | 5.0 | 8.0 |

TABLE 5

Magnetic Levitation Force of Pellets Fabricated with the Addition of Silver Oxide

| Silver Oxide wt % | Magnetic Levitation Force with no $Nd_2O_3$ Embedded, kgf | Magnetic Levitation Force, with $Nd_2O_3$ Embedded, kgf |
| --- | --- | --- |
| 1 | 1.2 | 2.4 |
| 5 | 1.5 | 2.6 |
| 10 | 1.4 | 2.6 |
| 15 | 1.1 | 2.0 |
| 20 | 1.3 | 1.7 |
| 25 | 1.1 | 1.5 |

TABLE 6

Embedded Nucleants, and Magnetic Levitation Force

| Embedded Nucleants | Magnetic Levitation Force, kgf |
| --- | --- |
| — | 5.5 |
| $Sm_2O_3$ | 8.5 |
| $Nd_2O_3$ | 8.1 |

TABLE 7

| Nucleants | Magnetic Levitation Force, kgf |
| --- | --- |
| — | 1.4 |
| MgO | 2.0 |
| $SrTiO_3$ | 1.9 |

Throughout the following examples, platinum or platinum compound powders were added to the pulverized powders.

Example 10

$Y_2O_3$, $BaCO_3$ and CuO powders were mixed together at a molar Y:Ba:Cu ratio of 1.8:2.4:3.4. Following this, the mixture was heated at 1,400° C. for 20 minute, followed by cooling. The product was pulverized and sufficiently mixed with 0.5% by weight of platinum powders, and the mixture was then shaped into a pellet. About 10 mg of powders of $Nd_2O_3$, $Sm_2O_3$, $Eu_2O_3$, $La_2O_3$, $Sm_2BaCuO_5$, $Eu_2BaCuO_5$, $NdBa_2Cu_3O_d$ or $EuBa_2Cu_3O_d$ were embedded as the nucleants in the center of the upper surface of each pellet. The pellet was then heated at 1,100° C. for 30 minutes for separation into the 211 phase and liquid phases mentioned above, which were cooled down to 1,010° C. over 10 minutes. After this, the product was slowly cooled down to about 900° C. at 1° C. per hour, followed by furnace cooling. Subsequently, the product was heated at 600° C. for 1 hour in a 1-atm oxygen stream, and finally subjected to furnace cooling to obtain a superconductor pellet of about 26 mm in diameter and about 6 mm in height. For the purpose of comparison, a superconductor pellet was prepared with no powder placed thereon.

As can be understood from Table 8, the superconductor pellet with no nucleates embedded therein is 0.3 cm² in crystal size, as observed from above, whereas the superconductor pellets with the nucleates embedded therein are all increased in crystal size to 1.0 cm2 or more.

Figure 3:
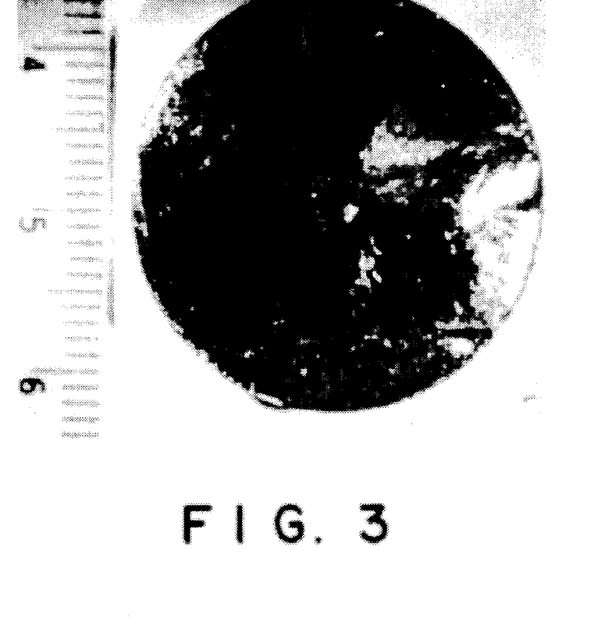
FIG. 3 is a microphotograph of a superconducting crystal obtained with nucleants in Example 10 of the invention.
Figure 4:
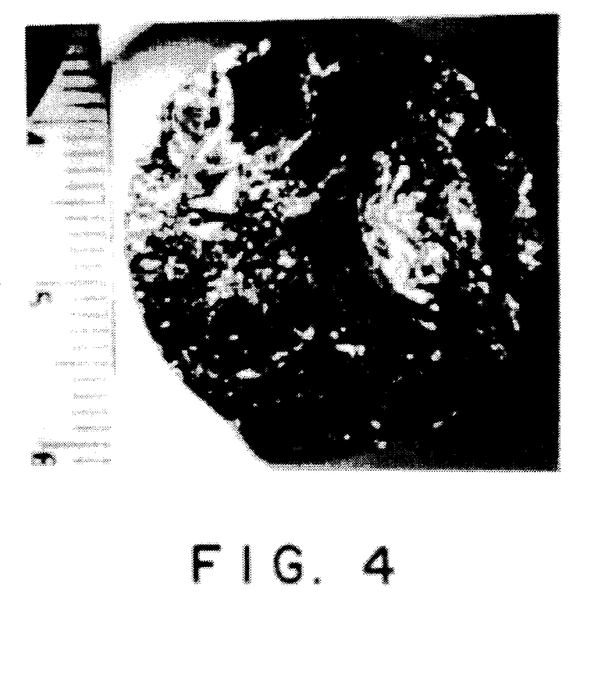
FIG. 4 is a microphotograph of a superconducting crystal obtained following Example 10 with the exception that no nucleants are used.

Photographs of the superconductive phases with and without the nucleates embedded therein, respectively, are attached hereto—FIGS. 3 and 4. A comparison of these photographs teaches that greater crystal size can be achieved according to the invention.

Example 11

Superconductor pellets were prepared, with and without the nucleates used in Example 10, following the procedure of Example 10. Pellet size was the same as in Example 10. The magnetic leviation force of these pellets were measured according to the procedure of Example 2. As set out in Table 8, the magnetic levitation force of the pellet with no nucleates embedded therein is 1.1 kgf, whereas those of the pellets with the nucleates embedded therein are elavated to 1.6 kgf or larger.

Example 12

Superconductor pellets were prepared following the procedure of Example 10 with the exception that $RE_2O_3$ was used in place of $Y_2O_3$ of the starting feed for superconductor production and about 10 mg of $Sm_2O_3$ powders was placed on the center of the upper surface of each disc. The magnetic levitation forces of these pellets, as measured following the procedure of Example 11, are set out in Table 9, which reveals that the effect of the $Sm_2O_3$ powders placed is found throughout the RE systems.

Example 13

$Yb_2O_3$, $BaO_2$ and CuO powders were mixed together at a molar Yb:Ba:Cu ratio of 1.8:2.4:3.4. Following this, the mixture was heated at 1,400° C. for 20 minute, followed by cooling. The product was pulverized and sufficiently mixed with 1% by weight of platinum powders, and the mixture was then shaped into a pellet. About 10 mg of powders of $Ho_2O_3$, $Er_2O_3$, $HoBaCuO_5$, $Er_2BaCuO_5$, $HoBa_2Cu_3O_d$, and $ErBa_2Cu_3O_d$ were embedded as the nucleants in the center of the upper surface of each pellet. The pellet was then heated at 1,060° C. for 30 minutes for separation into the 211 phase and liquid phases, which were cooled down to 960° C. over 10 minutes. After this, the product was slowly cooled down to about 850° C. at 1° C. per hour, followed by furnace cooling. Subsequently, the product was heated at 600° C. for 1 hour in a 1-atm oxygen Stream, and finally subjected to furnace cooling to obtain a superconductor pellet of about 26 mm in diameter and about 6 mm in height. For the purpose of comparison, a superconductor pellet was prepared with no nucleates placed thereon. These superconductor pellets were measured as to their magnetic leviation forces, according to the procedure of Example 2.

As can be understood from Table 10, the magnetic levitation force of the superconductor pellet with no nucleates placed thereon is barely about 0.9 kgf, whereas those of the pellets with the nucleates placed on them were all brought up to 1.3 kgf or larger.

Example 14

$Y_2O_3$, $BaCuO_2$ and $CuO$ powders were mixed together at a molar Y:Ba:Cu ratio of 1.8:2.4:3.4. Following this, the mixture was heated at 1,400° C. for 20 minute, followed by cooling. The product was pulverized and sufficiently mixed with 0.5% by weight of platinum powders, and the mixture was then shaped into a pellet. About 10 mg of $Sm_2O_3$ or $Nd_2O_3$ powders were placed as the nucleates on the center of the lower surface of the pellet. Subsequently, the pellet was heated at 1,100° C. for 30 minutes for separation into the 211 and liquid phases, which were cooled down to 1,010° C. over 10 minutes. After this, the pellet was slowly cooled down to 890° C. at 1° C. per hour with a temperature gradient of 1° C./cm in such a way that the temperature of the lower surface of the pellet reached a low, followed by furnace cooling. In this example, the table used was made up of alumina. Then, the pellet was heated at 600° C. for 1 hour in a 1-atm oxygen stream, and finally subjected to furnace cooling to prepare a superconductor pellet of about 26 mm in diameter and about 6 mm in height. For the purpose of comparison, a superconductor pellet with no necleator embedded in it was prepared as well.

These superconductor pellets were measured as to their magnetic levitation forces, following the procedure of Example 2.

From the results set out in Table 11, it is noted that the magnetic levitation force of the pellet with no nucleates embedded in it is barely about 1.1 kgf, whereas those of the pellets with the nucleators embedded in them are all increased to 2.0 kgf or more.

Example 15

$YBa_2Cu_3O_d$ and $Y_2CuBaO_5$ powders were mixed together at a Y:Ba:Cu ratio of 1.8:2.4:3.4. Following this, the mixture was heated at 1,400° C. for 20 minutes, followed by cooling. The product was then pulverized and sufficiently mixed with 1% by weight of platinum powders, and the mixture was shaped into a pellet. $Nd_2O_3$ powders (ca. 10 mg) were embedded as the nucleates in the vertically central portion of one side of the pellet. Each pellet was heated at 1,100° C. for 30 minutes for separation into the 211 and liquid phases, which were then cooled down to 1,050° C. over 10 minutes. After this, the pellet was slowly cooled down to 850° C. at 1° C. per hour with a temperature gradient of 2° C./cm, 6° C./cm, or 10° C./cm in such a way that the temperature of the side of the pellet with the nucleates embedded therein reached a low, followed by furnace cooling. In this example, the table used was made up of alumina, and a disc of 30-mm-diameter and 3-mm-thcikness which was made of $YbBa_2Cu_3O_d$ bulk with a $Yb_2CuBaO_5$ phase dispersed in it was inserted between the pellet and the table in a buffer. Subsequently, the pellet was heated at 600° C. for 1 hour in a 1-atm oxygen stream, and finally subjected to furnace cooling to make a superconductor pellet of about 36 mm in diameter and about 12 mm in height. For the purpose of comparison, a superconductor pellet with no nucleants embedded in it was fabricated as well.

These superconductor pellets were measured as to their magnetic levitation forces, following the procedure of Example 11. The results set out in Table 12 indicate that the effect of the $Nd_2O_3$ powders embedded is found in the superconductors produced by the slow cooling with some temperature gradients.

Example 16

$Y_2CuBaO_5$, $BaCuO_2$ and $CuO$ powders were mixed together at a Y:Ba:Cu ratio of 1.8:2.4:3.4. The mixture was then heated at 1,400° C. for 20 minutes, followed by cooling. The product was pulverized and sufficiently mixed with 0.5% by weight of platinum powders, and the mixture was then shaped into a rectangular plate shape by means of isotropic pressing. A nucleates, $Sm_2O_3$ (ca. 10 mg), was embedded in the center of the upper face of the plate. The plate was further heated at 1,100° C. for 30 minutes for separation into the 211 and liquid phases, which were cooled down to 1,010° C. over 10 minutes. After this, the plate was slowly cooled down to 900° C. at 1° C. per hour, followed by furnace cooling. Subsequently, the plate was heated at 600° C. for 1 hour in a 1-atm oxygen stream, and finally subjected to furnace cooling to make a superconductor plate of about 14 mm x about 41 mm x about 15 mm. For the purpose of comparison, a superconductor plate with no nucleates placed on it was prepared as well. These plates were found to have no crack on their appearances, as observed visually.

These plates were measured as to their magnetic levitation forces, following the procedure of Example 2.

The results reveal that the magnetic levitation force of the pellet with no nucleates embedded in it is barely 3.8 kfg, whereas the plates with the nucleates embedded in it was increased to 5.0 kgf.

TABLE 8

Embedded Nucleants, Crystal Size, and Magnetic

| Embedded Nucleants | Mean Crystal Size $cm^2$, as measured from above | Magnetic Levitation Force kgf |
|---|---|---|
| — | 0.3 | 1.1 |
| $Nd_2O_3$ | 2.9 | 1.7 |
| $Sm_2O_3$ | 2.8 | 1.9 |
| $La_2O_3$ | 2.7 | 1.8 |
| $Eu_2O_3$ | 2.4 | 1.8 |
| $Sm_2BaCuO_5$ | 2.5 | 2.0 |
| $Eu_2BaCuO_5$ | 2.2 | 1.6 |
| $NdBa_2Cu_3O_d$ | 2.8 | 1.9 |
| $EuBa_2Cu_3O_d$ | 2.1 | 1.6 |

TABLE 9

Substituent, and Magnetic Levitation Force

| Substituent for Y | Magnetic Levitation Force, kgf |
|---|---|
| Eu | 1.5 |
| Gd | 1.7 |
| Dy | 1.8 |
| Ho | 1.6 |
| Er | 1.9 |
| Yb | 2.0 |

TABLE 10

Embedded Nucleants, and Magnetic Levitation Force kgf

| Embedded Nucleants | Magnetic Levitation Force, kgf |
|---|---|
| — | 0.9 |
| $Ho_2O_3$ | 1.3 |
| $Er_2O_3$ | 1.5 |
| $Ho_2BaCuO_5$ | 1.5 |
| $Er_2BaCuO_5$ | 1.4 |
| $HoBa_2Cu_3O_d$ | 1.4 |

TABLE 10-continued

Embedded Nucleants, and Magnetic Levitation Force kgf

| Embedded Nucleants | Magnetic Levitation Force, kgf |
|---|---|
| $ErBa_2Cu_3O_d$ | 1.3 |

TABLE 11

Nucleants, and Magnetic Levitation Force

| Nucleants | Magnetic Levitation Force, kgf |
|---|---|
| — | 1.1 |
| $Nd_2O_3$ | 2.1 |
| $Sm_2O_3$ | 2.0 |

TABLE 12

Magnetic Levitation Force Measured with Temperature Gradients

| Temp. Gradient °C./cm | Magnetic Levitation Force with no Nucleants or Embedded, kgf | Magnetic Levitation Force, with Nucleants Embedded, kgf |
|---|---|---|
| 2 | 4.5 | 6.8 |
| 6 | 4.4 | 7.9 |
| 10 | 4.0 | 7.2 |

According to the invention explained above, there is provided a method of producing an REBaCuO oxide superconductor which can not only increase superconducting crystal size and so achieve large magnetic levitation force, but is also well fit for mass-production of such a superconductor, because it can dispense with complicated equipment or operation or, it is simple in operation.

What is claimed is:

1. A method for producing an RE—Ba—Cu—O superconductor having large magnetic levitation force, where RE is a rare earth element selected from the group consisting of Y, Sm, Eu, Gd, Dy, Ho, Er, and Yb, which involves:

providing a starting feed comprising a raw material mixture in powdered form, heating said raw material mixture for partial melting, followed by cooling and solidification of the partially melted raw material mixture to a solid, pulverizing said solid to achieve pulverized powders, mixing said pulverized powders to achieve mixed powders, shaping said mixed powders into a given shape, heating said shape for partial melting to achieve a partial melt, cooling said partial melt to a temperature at which a superconducting phase starts to form, followed by slow cooling, whereby a superconducting phase is formed and grown from a nucleation site, wherein the method further comprises placing or embedding nucleants on or in said shape at any point between completion of said sharing and just prior to said slow cooling.

2. A method according to claim 1, wherein said nucleants are placed or embedded in the shape prior to said heating of said shade for partial melting.

3. A method according to claim 1, wherein said nucleants are a rare earth element-containing oxide selected from the group consisting of $Y_2O_3$, $Nd_2O_3$, $Sm_2O_3$, $Eu_2O_3$, $La_2O_3$, $Gd_2O_3$, $DY_2O_3$, $Ho_2O_3$, $Er_2O_3$, $Yb_2O_3$, $Y_2BaCuO_5$, $Sm_2BaCuO_5$, $Eu_2BaCuO_5$, $Gd_2BaCuO_5$, $DY_2BaCuO_5$, $Ho_2BaCuO_5$, $Er_2BaCuO_5$ and $Yb_2BaCuO_5$.

4. A method according to claim 1, wherein said nucleates are selected from the group consisting of $CeO_2$, $ZrO_2$, $BaSnO_3$, $BaZrO_3$, MgO, and $SrTiO_3$.

5. A method according to claim 1, wherein said nucleates are selected from the group consisting of Pt, Pd, Rh, Ir, Os, and Ru.

6. A method according to claim 1, wherein the nucleates used are a powder or single crystal.

7. A method according to claim 1, wherein platinum or platinum compound powders are added to said pulverized powders.

8. A method according to claim 7, wherein said platinum or platinum compound powders are added in an amount of 0.1 to 2% by weight, calculated as platinum.

9. A method according to claim 1, wherein said shaping is carried out after silver or silver oxide powders have been added to and mixed with said pulverized powders in an amount of 1 to 25% by weight of said raw material mixture.

10. A method according to claim 1, wherein said slow cooling starts from a temperature somewhat higher than the temperature at which a superconducting phase forms from $RE_2BaCuO_5$ and liquid phases that coexist at a time of the partial melting.

11. A method according to claim 1, wherein a temperature for the partial melting of said shape ranges from 950 to 1,250° C.

12. A method according to claim 1, wherein a rate of said slow cooling ranges from 0.2° to 20° C. per hour.

13. A method according to claim 1, wherein a temperature for the partial melting of said starting feed ranges from 950° to 1,500° C.

14. A method according to claim 1, wherein the starting feed is cooled at a rate that equals or exceeds that of air cooling after the partial melting.

15. A method according to claim 1, wherein said slow cooling takes place with a temperature gradient of 1° C./cm or more around a location of the shape where the nucleants are located so that the temperature of said location is at a low.

16. A method according to claim 1, wherein a buffer is located between the shape and a table on which the shape is placed at the step of forming the superconducting phase after the shaping, said buffer having a bulk or shape comprising an RE element that is lower than said shape in terms of the temperature at which the superconducting phase starts to.

17. A method according to claim 16, wherein the table used is well wettable by said liquid phase.

18. A method according to claim 1, wherein after the superconducting phase has been grown by said slow cooling, it is retained in a temperature range of 650° to 300° C. for 2 to 500 hours in an oxygen-enriched atmosphere, or it is cooled from a high of 650° C. to a low of 300° C. over 2 to 500 hours, thereby adding oxygen to the superconducting phase.

* * * * *